(12) United States Patent
Iwagami

(10) Patent No.: US 12,170,831 B2
(45) Date of Patent: Dec. 17, 2024

(54) IMAGE CAPTURING APPARATUS FOR CONTROLLING A FAN ROTATION NUMBER BASED ON A SHOOTING ENVIRONMENT AND A DETERMINED SUBJECT

(71) Applicant: CANON KABUSHIKI KAISHA, Tokyo (JP)

(72) Inventor: Takuma Iwagami, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 104 days.

(21) Appl. No.: 18/046,852

(22) Filed: Oct. 14, 2022

(65) Prior Publication Data

US 2023/0126699 A1 Apr. 27, 2023

(30) Foreign Application Priority Data

Oct. 21, 2021 (JP) .................. 2021-172650

(51) Int. Cl.
| | |
|---|---|
| H05K 7/20 | (2006.01) |
| G03B 17/55 | (2021.01) |
| G06V 10/12 | (2022.01) |
| H04N 23/52 | (2023.01) |
| H04N 23/60 | (2023.01) |
| H04N 23/61 | (2023.01) |
| H04N 23/65 | (2023.01) |

(52) U.S. Cl.
CPC ............ *H04N 23/52* (2023.01); *G03B 17/55* (2013.01); *G06V 10/12* (2022.01); *H04N 23/60* (2023.01); *H04N 23/61* (2023.01); *H04N 23/65* (2023.01); *H04N 23/651* (2023.01); *H05K 7/20209* (2013.01)

(58) Field of Classification Search
CPC ........ H04N 23/52; H04N 23/57; H04N 23/60; H04N 23/61; H04N 23/65; H04N 23/651; H04N 25/709; G03B 17/55; G03B 2217/007; H05K 7/20209; H05K 7/20136; H05K 7/20172; G06V 10/12
See application file for complete search history.

(56) References Cited

U.S. PATENT DOCUMENTS 7,755,687 B2 * 7/2010 Fukushima ............ H04N 23/54
  348/300
9,383,540 B1 * 7/2016 Gandhi .................. G02B 7/008
(Continued)

FOREIGN PATENT DOCUMENTS

| JP | 2004-200778 A | 7/2004 |
| JP | 2007-207421 A | 8/2007 |
| JP | 2010-062892 A | 3/2010 |

*Primary Examiner* — Timothy J Henn
*Assistant Examiner* — Akshay Trehan
(74) *Attorney, Agent, or Firm* — Canon U.S.A., Inc. IP Division

(57) ABSTRACT

This disclosure provides an image capturing apparatus including an image capturing unit, which comprises a determination unit for determining a subject and a shooting environment based on data obtained by the image capturing unit; an air cooling unit for rotating a fan for cooling the image capturing apparatus; and a control unit for controlling a fan rotation number per unit time of the air cooling unit, wherein the control unit sets a fan rotation number upper limit value of the air cooling means according to the result of determination by the determination unit.

8 Claims, 4 Drawing Sheets

(56) References Cited

U.S. PATENT DOCUMENTS

| | | | |
|---|---|---|---|
| 10,270,962 B1 | 4/2019 | Stout | |
| 2015/0070557 A1* | 3/2015 | Petty | G03B 17/55 |
| | | | 348/335 |
| 2017/0060203 A1* | 3/2017 | Hagiwara | H04N 1/00 |
| 2018/0336398 A1* | 11/2018 | Shenoy | G06F 1/3206 |
| 2019/0154949 A1* | 5/2019 | Hosoe | G05D 23/1919 |
| 2019/0335074 A1 | 10/2019 | Malkes | |
| 2021/0298200 A1* | 9/2021 | Miki | F21V 29/61 |
| 2022/0394188 A1* | 12/2022 | Sakanaka | H04N 23/631 |

* cited by examiner

IMAGE CAPTURING APPARATUS FOR CONTROLLING A FAN ROTATION NUMBER BASED ON A SHOOTING ENVIRONMENT AND A DETERMINED SUBJECT

BACKGROUND OF THE INVENTION

Field of the Invention

The present invention relates to an image capturing apparatus, a control method thereof, and a non-transitory computer-readable storage medium.

Description of the Related Art

A television camera system including a switch for designating an automatic mode and a switch for designating a silent mode in order to perform fan control is disclosed in Japanese Patent Laid-Open No. 2004-200778. Disclosed is a technique that, when the silent mode is selected by a user's switch operation, if the temperature is a given threshold or less, a fan is caused to rotate at a rotation number that is lower than that in the automatic mode at the same temperature.

However, with the method disclosed in this literature, a user needs to manually select the rotation number of the fan while shooting is performed, and therefore it is difficult for the user to focus on shooting. As a result, with the technique disclosed in this literature, the usability of an image capturing apparatus degrades.

SUMMARY OF THE INVENTION

Therefore, the present invention provides a technique for enabling fan rotation control according to the shooting situation, which does not require user's special operation.

According to an aspect of the present invention, there is provided an image capturing apparatus including an image capturing unit, comprising: a determination unit configured to determine a subject and a shooting environment based on data obtained by the image capturing unit; an air cooling unit configured to rotate a fan for cooling the image capturing apparatus; and a control unit configured to control a fan rotation number per unit time of the air cooling unit, wherein the control unit sets a fan rotation number upper limit value of the air cooling unit according to the result of determination by the determination unit.

According to the present invention, fan rotation control according to the shooting situation can be performed without user's special operation.

Further features of the present invention will become apparent from the following description of embodiments (with reference to the attached drawings).

DESCRIPTION OF THE EMBODIMENTS

Figure 1:
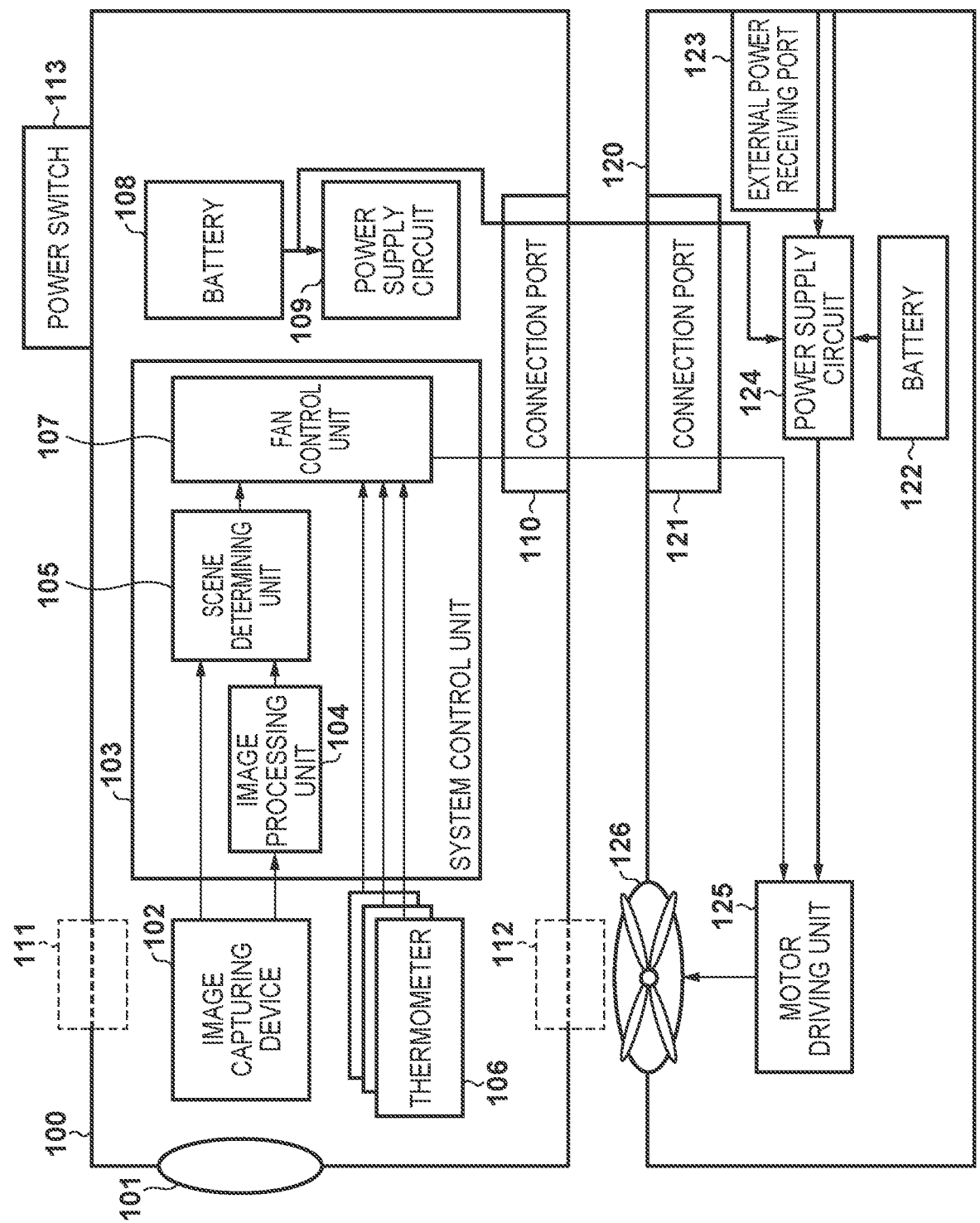
FIG. 1 is a block diagram illustrating constituent elements of an image capturing apparatus and a cooling apparatus in a first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted. Each of the embodiments of the present invention described below can be implemented solely or as a combination of a plurality of the embodiments or features thereof where necessary or where the combination of elements or features from individual embodiments in a single embodiment is beneficial.

First Embodiment

FIG. 1 is a block diagram for describing the constituent elements of an image capturing apparatus 100 and a cooling apparatus 120 in a first embodiment. The cooling apparatus 120 includes a fan (cooling fan) for cooling the image capturing apparatus 100. Note that the image capturing apparatus 100 is a network camera, for example, and distributes video data obtained by capturing to a network. It should be noted that, because the configuration regarding the video distribution is not main objective of the present invention, only the configuration regarding cooling is illustrated.

The image capturing apparatus 100 includes a lens unit 101, an image capturing device 102, a system control unit 103, a thermometer 106, a battery 108, a power supply circuit 109, a power switch 113, and a connection port 110. Note that the frame line indicated by the reference numeral 100 also shows a case of the image capturing apparatus 100. Also, air vents 111 and 112 are provided in the case of the image capturing apparatus 100.

The lens unit 101 converges light from a subject and forms an image on an imaging plane of the image capturing device 102. The image capturing device 102 is a CMOS sensor, for example. The image capturing device 102 converts an optical image formed on the imaging plane by the lens unit 101 to an electric signal, and supplies the electric signal to the system control unit 103 as image data.

The system control unit 103 controls the image capturing apparatus 100 and the cooling apparatus 120. The system control unit 103 includes at least one CPU, a program to be executed by the CPU, a ROM that stores various types of parameters and a table, and a RAM to be used as a work area of the CPU. An image processing unit 104, a scene determining unit 105, and a fan control unit 107 that are included in the system control unit 103 function as a result of the CPU executing a program stored in the ROM. Note that the image processing unit 104, the scene determining unit 105, and the fan control unit 107 may also be constituted by hardware that is independent from the CPU.

The image processing unit 104 receives image data supplied from the image capturing device 102, and converts the image data to image data in a predetermined still image/moving image format by performing image processing.

The scene determining unit 105 performs processing for specifying a subject in an image and/or processing for specifying a shooting environment of the image capturing apparatus 100, based on image data obtained from the image capturing device 102 or image data in any format that is obtained by conversion performed by the image processing unit 104. For example, the scene determining unit 105 can determine the shooting scene such as the image capturing apparatus 100 being currently located outdoors or indoors, for example, from a plurality of pieces of information such as information regarding the brightness of a subject in an image indicated by image data obtained by the image capturing device 102 and illumination flickering information. Also, the system control unit 103 including the scene determining unit 105 has learned, in advance, image data and features of a large amount of shooting scenes by using deep learning technology. Also, the scene determining unit 105 extracts a feature of an image from image data from the image capturing device 102 or image data obtained by conversion performed by the image processing unit 104. Also, the scene determining unit 105 determines the shooting scene, that is, in what location the image capturing apparatus 100 is currently placed and what subject the image capturing apparatus 100 is attempting to shoot, for example, using learning data stored in advance. The scene determining unit 105 supplies the determination result to the fan control unit 107 as shooting scene information.

The thermometer 106 measures the temperature of the image capturing apparatus 100, and supplies information indicating the measured temperature to the fan control unit 107 of the system control unit 103. A plurality of the thermometers 106 may also be provided. The thermometer 106 is a thermistor or a digital thermometer, for example.

The fan control unit 107 controls the rotation number (precisely speaking, the rotation number per unit time, and the unit is rpm (rotations per minute)) of a fan included in the cooling apparatus 120, and cools the image capturing apparatus 100. Therefore, the fan control unit 107 determines the target rotation number of the fan based on temperature information acquired from the thermometer 106 and shooting scene information acquired from the scene determining unit 105. Note that when a plurality of thermometers 106 are present, the fan control unit 107 may calculate an average value of the temperatures indicated by a plurality of pieces of temperature information from those thermometers, and determine the target rotation number of the fan based on the calculated average value and the shooting scene information. Upon determining the target rotation number, the fan control unit 107 calculates a duty ratio in PWM (Pulse Width Modulation) control according to the target rotation number. Also, the fan control unit 107 PWM—controls a DC motor that rotates the fan using a signal with the calculated duty ratio. Accordingly, the effective voltage applied to the DC motor is controlled, and the fan can be driven at the target rotation number.

The battery 108 is housed in the image capturing apparatus 100. The power supply circuit 109 converts the voltage of the battery 108 to voltages suitable for the constituent elements (image capturing device 102, system control unit 103, and the like) of the image capturing apparatus 100, and supplies the voltages.

The connection port 110 is for connecting the image capturing apparatus 100 to the cooling apparatus 120. The aforementioned signal from the fan control unit 107 is supplied to the cooling apparatus 120 via the connection port 110. Also, the connection port 110 can supply electric power for operating the cooling apparatus 120 to the cooling apparatus 120 from the image capturing apparatus 100. The connection port 110 is a USB (Universal Serial Bus) connector, for example.

The power switch 113 is for switching on and off of electric power from the battery 108 to the power supply circuit 109. When a user switches on the power switch 113, electric power from the battery 108 is supplied to the power supply circuit 109, and the image capturing apparatus 100 starts functioning.

The cooling apparatus 120 includes a connection port 121, a battery 122, an external power receiving port 123, a power supply circuit 124, a motor driving unit 125, and an air feeding unit 126.

The connection port 121 is for connecting the cooling apparatus 120 to the image capturing apparatus 100. The cooling apparatus 120 can receive a control signal from the image capturing apparatus 100 via the connection port 121. Also, the cooling apparatus 120 can receive electric power for operating the fan from the image capturing apparatus 100 via the connection port 121. The connection port 121 is a USB connector, for example.

The cooling apparatus 120 can operate with electric power supplied from the image capturing apparatus 100 via the connection port 121. Also, the cooling apparatus 120 can operate with electric power from the battery 122. Also, the cooling apparatus 120 can operate with electric power supplied from an external power supply (not illustrated) via the external power receiving port 123.

The power supply circuit 124 can convert electric power from the battery 122, electric power received from the image capturing apparatus 100, or electric power from an external power supply connected to the external power receiving port 123 to a voltage suitable for driving the fan. Also, when electric power is input from a plurality of power sources, the power supply circuit 124 can select one of the power sources, and use electric power from the selected power source to drive the cooling apparatus 120. For example, when an AC adapter is connected to the external power receiving port 123, and electric power is also supplied from the battery 122 and from the image capturing apparatus 100, the power supply circuit 124 preferentially selects electric power from the AC adapter and use the electric power to operate the fan. Accordingly, the fan can be operated while suppressing consumption of the batteries.

The motor driving unit 125 drives a DC motor in the air feeding unit 126. The fan control unit 107 of the image capturing apparatus 100 can drive the DC motor at any rotation number by supplying a PWM modulation signal to the DC motor. Here, the voltage applied between DC motor terminals is a voltage supplied from the power supply circuit 124.

The air feeding unit 126 is constituted by the DC motor and a fan (propeller). Also, the fan rotates by rotation of the DC motor, and as a result, an air flow is generated. The fan in the air feeding unit 126 is located in the vicinity of the air vent 112. Accordingly, the air feeding unit 126 can feed air to the inside of the image capturing apparatus 100 from the outside via the air vent 112. The other air vent 111 of the image capturing apparatus 100 is for discharging warm air inside the image capturing apparatus 100 to the outside. Air cooling of the image capturing apparatus 100 is performed in this way.

Note that the configuration diagram in FIG. 1 shows an example in which the cooling apparatus 120 is provided outside the image capturing apparatus 100, but the configuration may also be such that the image capturing apparatus 100 incorporates the cooling apparatus 120.

Next, the cooling processing of the image capturing apparatus 100 in the first embodiment will be described with reference to FIGS. 2 and 3.

Figure 2:
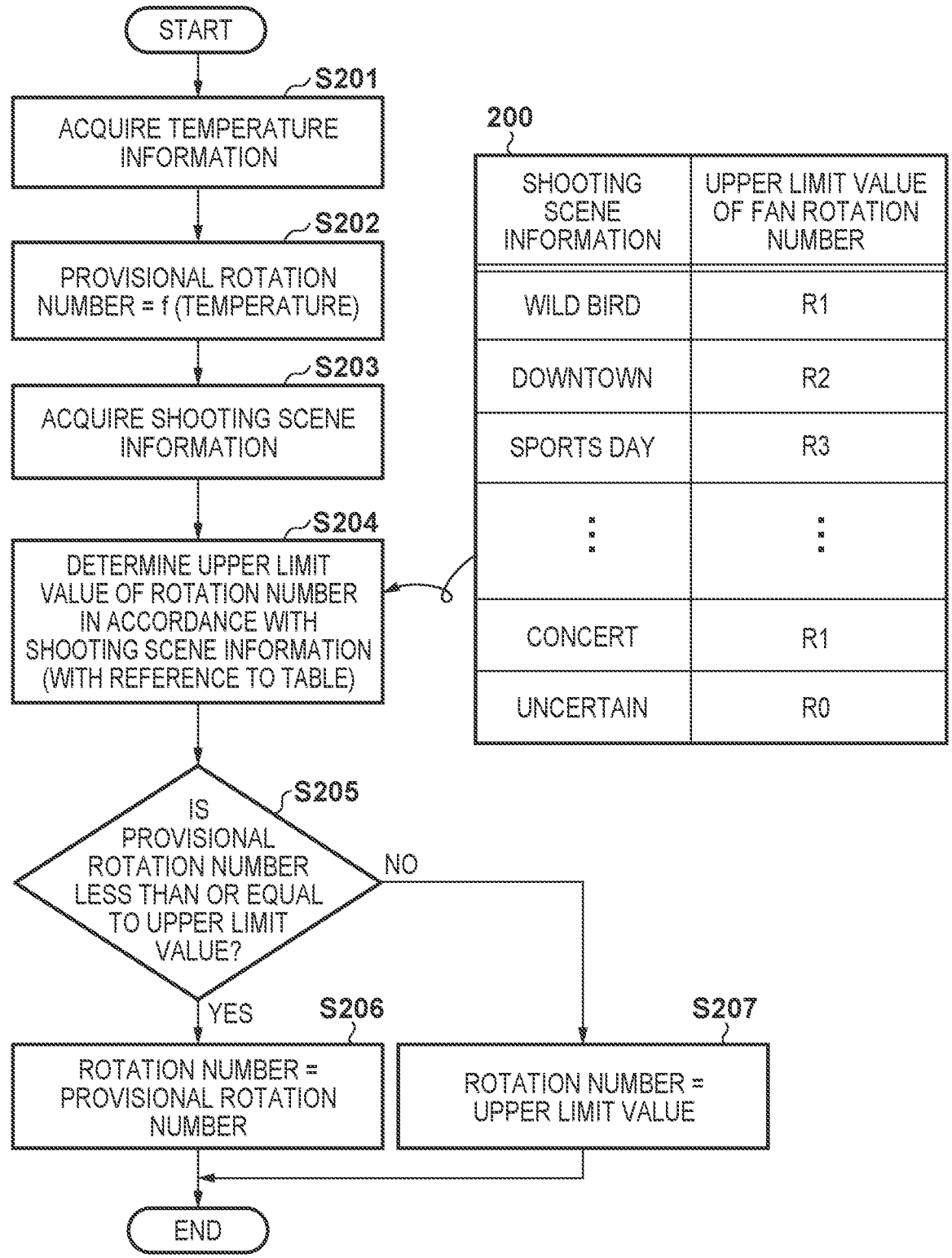
FIG. 2 is a flowchart illustrating fan rotation number determination processing in the first embodiment.

FIG. 2 is a flowchart illustrating a fan rotation number determination process performed by the fan control unit 107 in the first embodiment. Note that it is assumed that the fan control unit 107 executes the processing in FIG. 2 at preset time intervals (e.g., 10 seconds interval).

In step S201, the fan control unit 107 acquires temperature information needed for determining the fan rotation number from the thermometer 106. Then, the fan control unit 107 advances the processing to step S202.

In step S202, the fan control unit 107 transforms the temperature indicated by the temperature information acquired in step S201 to a provisional fan rotation number. The cooling effect increases proportional to the fan rotation number. Therefore, the higher the temperature is, the larger number the fan rotation number needs to be increased to in order to improve the cooling effect. Conversely, when the temperature is low, the fan rotation number may be decreased. Therefore, the fan control unit 107 obtains the provisional fan rotation number f following the next equation, for example.

$$f = k \times \text{temperature of the image capturing apparatus } 100$$

Here, "k" is a positive transformation coefficient for transforming the temperature of the image capturing apparatus 100 to the fan rotation number. Note that the reason why "provisional" is appended to the rotation number is that the rotation number obtained here may be changed in a subsequent step.

Next, in step S203, the fan control unit 107 acquires shooting scene information from the scene determining unit 105.

Then, in step S204, the fan control unit 107 transforms the acquired shooting scene information to an upper limit value of the fan rotation number.

It is possible that the cooling effect is increased by increasing the fan rotation number. However, as the fan rotation number increases, the operating noise generated by the fan also increases. The air feeding unit 126 of the cooling apparatus 120 according to the embodiment has such characteristics.

Incidentally, there are cases where the operating noise generated by the fan is desired to be decreased, or the operating noise is allowed to be large, depending on the environment in which the image capturing apparatus 100 is placed, or the subject to be shot. For example, in a situation in which a wild bird is shot in a forest, generation of undesired sounds is desired to be avoided. It is because a wild bird may go away astonished by the undesired sounds. Therefore, when a wild bird is shot, it is desirable that the fan operating noise of the image capturing apparatus is decreased. Also, in a concert hall or the like, the fan operating noise may become annoyance to surrounding audiences. In such shooting situation as well, the fan operating noise needs to be suppressed to minimum. On the other hand, in a situation in which snap shot shooting is performed in downtown, or in a situation of children's sports day, even if the fan operating noise is large, the persons in the vicinity may not notice the fan operating noise and may not care about it. As described above, the allowable level of the operating noise generated by the fan depends on the shooting situation.

Therefore, the system control unit 103 according to the embodiment retains a table 200 in an internal ROM or RAM. This table 200 is used to associate the shooting scene information with the upper limit value of the fan rotation number.

For example, when the shooting scene information indicates "wild bird", the upper limit value of the fan rotation number is "R1". This indicates that, when the image capturing apparatus 100 is shooting a wild bird, the allowable range of the fan rotation number of the air feeding unit 126 is 0 to R1. Also, when the shooting scene information indicates "downtown", the upper limit value of the fan rotation number is "R2". This indicates that, when the image capturing apparatus 100 is performing shooting in downtown, the allowable range of the fan rotation number of the air feeding unit 126 is 0 to R2. Note that "uncertain" indicating that the scene determination is not possible, and an upper limit value R0 of the fan rotation number in this case are included in the table 200. Here, the relationship between upper limit values R0 to R3 of the fan rotation number is R0<R1<R2<R3.

In step S204, the fan control unit 107 determines, as described above, the upper limit value of the fan rotation number of the air feeding unit 126 based on the shooting scene information acquired from the scene determining unit 107. Then, the fan control unit 107 advances the processing to step S205.

In step S205, the fan control unit 107 compares the provisional rotation number obtained in step S202 with the upper limit value obtained in step S204. If the provisional rotation number is the upper limit value or less, the fan control unit 107 advances the processing to step S206. Also, if the provisional rotation number exceeds the upper limit value, the fan control unit 107 advances the processing to step S207.

In step S206, the fan control unit 107 determines the provisional rotation number obtained from the temperature information as the ultimate fan rotation number. Even if the fan rotation number is increased to the rotation number upper limit determined based on the shooting scene information, the fan operating noise will not influence on shooting. However, if the fan rotation number is unnecessarily increased with respect to the temperature of the image capturing apparatus 100, the power consumption is unnecessarily increased. Therefore, in step S206, the provisional rotation number obtained from the temperature information is determined as the fan rotation number as is, regardless of the shooting scene.

In step S207, the fan control unit 107 determines the upper limit value (one of R0 to R3, in the embodiment) determined based on the shooting scene information as the ultimate fan rotation number.

Figure 3:
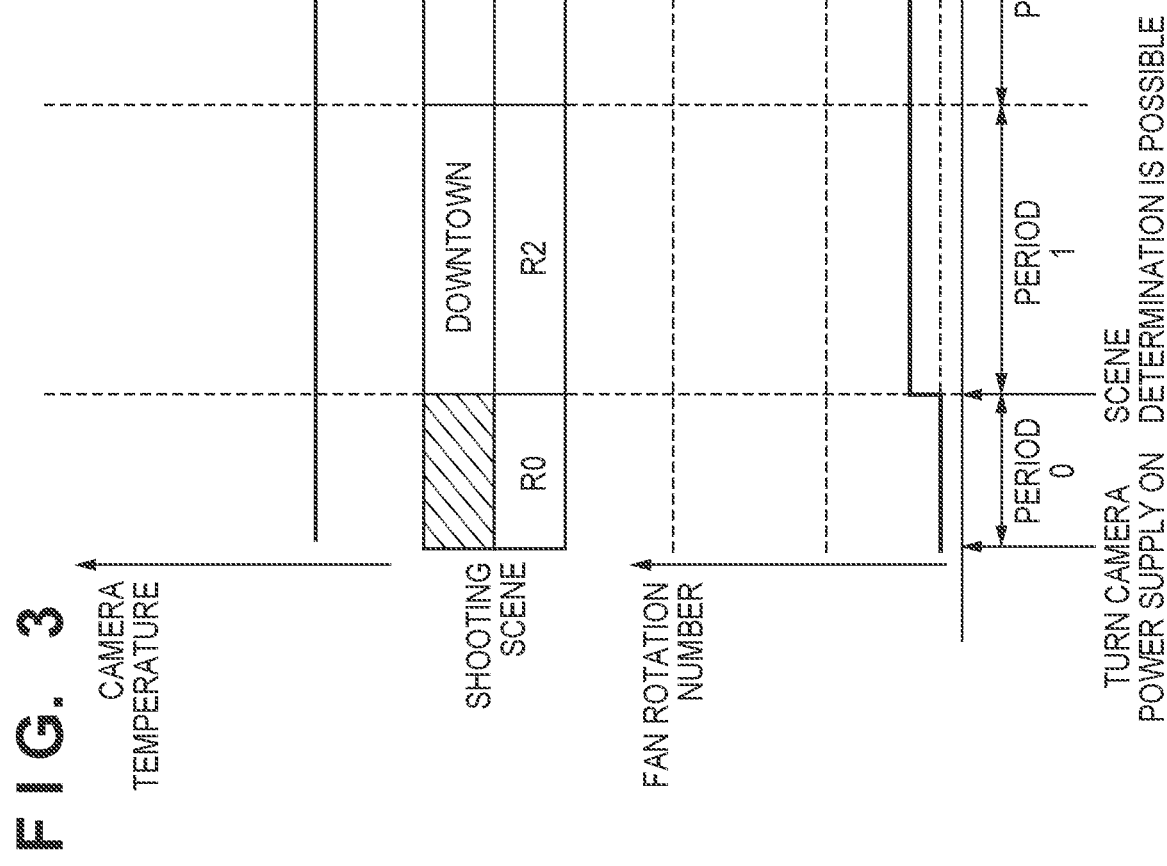
FIG. 3 is a diagram illustrating sequences of the temperature of the image capturing apparatus, the shooting scene, and the fan rotation number, in the first embodiment.

FIG. 3 is an example of a sequence diagram of the temperature information, the shooting scene information, and the fan rotation number.

A "period 0" is a period from when the image capturing apparatus 100 is started until when the scene determination becomes possible. In order for the scene determining unit 105 to enter a state in which scene determination is possible after a user turns on the power switch 113, constituent elements such as the power supply circuit 109, the system control unit 103, and the image capturing device 102 need to be normally initialized and to enter operating states, and therefore a considerable period of time is needed. In addition, the scene determining unit 105 may not recognize the shooting scene in a period in which the subject or the shooting environment is not stable. Therefore, in the period 0, the fan control unit 107 determines R0 as the upper limit value of the fan rotation number. Here, R0 is the smallest value of a candidate group {R0 to R3} of all of the upper limit values. Also, the rotation number of R0 may also be set to "0". R0=0 means that the fan is stopped. As a result, even if the user turns on the power switch 113 of the image capturing apparatus 100 with an intention of shooting a scene whose allowable level of the fan operating noise is relatively low, large fan operating noise can be suppressed from being generated against the user intention. This situation is easily understood if a case is envisioned where a user noticed presence of a wild bird and turned on the power of the image capturing apparatus 100, for example. The period from when the user turned on power until when the image capturing apparatus 100 enters a state in which a wild bird can be shot corresponds the "period 0". Therefore, the fan operating noise of the air feeding unit 126 will not hinder shooting of the wild bird.

Also, when the scene determination becomes impossible due to some factor after the scene has been determined once after the image capturing apparatus 100 was started, the fan rotation number upper limit value may be set to R0. Accordingly, in a situation in which the shooting scene rapidly changes and the scene determining unit 105 is unable to determine the scene, for example, the fan operating noise can be prevented from exceeding the allowable level. Alternatively, when the scene determination becomes impossible due to some factor after the scene has been determined once after the image capturing apparatus 100 was started, the fan rotation number upper limit value may be set to the upper limit value determined in association with the scene determined immediately before. Accordingly, when the scene momentarily switched while shooting is performed, and the scene determination is not possible in this moment, for example, it is possible to perform cooling while keeping the fan rotation number.

Return to the description of FIG. 3. A "period 1" is a period in which the scene determination became possible and the user is performing snap shot shooting in downtown. Also, the shooting scene information indicates "downtown", and therefore the fan rotation number upper limit value is R2. In the period 1, the rotation number obtained from the temperature information is R2 or less. Therefore, the processing in step S206 is performed, and the fan in the air feeding unit 126 operates at the rotation number determined by the temperature information.

A "period 2" is a period in which shooting of a wild bird is performed. Also, the shooting scene information indicates "wild bird", and therefore the fan rotation number upper limit value is R1. In the period 2, the rotation number upper limit value obtained from the temperature information is R1. Therefore, the processing in step S206 described above is performed. Therefore, the fan in the air feeding unit 126 operates at the rotation number determined by the temperature information.

A "period 3" is a period in which shooting of a wild bird is performed continuously to the "period 2". Therefore the fan rotation number upper limit value is R1. In the period 3, the rotation number obtained from the temperature information exceeds R1, and therefore the processing in step S207 is performed. Therefore the fan operates at the rotation number upper limit value R1 that is determined based on the shooting scene. Accordingly, the fan operating noise is suppressed to the allowable level or less, and the cooling operation can be performed in a range in which the shooting operation made by the user is not influenced.

A "period 4" is a period in which the user switches the shooting scene from a wild bird to downtown, and performs shooting in downtown. Also, the shooting scene information indicates "downtown", and therefore the fan rotation number upper limit value is R2. In the period 4, the fan rotation number obtained from the temperature information is R2 or less, and therefore the processing in step S206 described above is performed, and the fan in the air feeding unit 126 rotates at the rotation number determined by the temperature information. As described above, in a shooting scene in which the allowable level of fan operating noise is relatively high, as a result of setting the rotation number upper limit to a high value, the fan rotation number can be increased, and the cooling effect can be improved.

As described above, according to the first embodiment, an image capturing apparatus can be provided that can perform cooling control while suppressing the influence of fan operating noise on shooting. Furthermore, according to the image capturing apparatus 100 of the first embodiment, a user operation for controlling the cooling fan rotation number is not needed, and the user can focus on shooting.

Note that, in the above description, the fan control unit 107 executes the flowchart in FIG. 2 at 10 seconds interval, for example. Here, a configuration may also be adopted in which, when the processing in step S207 is successively executed for a predetermined number of times, the fan control unit 107 flicker-drives an unshown alarm lamp. Then, if the flicker driving of the alarm lamp continues exceeding a preset period of time, the fan control unit 107 requests power off to the system control unit 103. Upon receiving the request, the system control unit 103 may turn off the power of the image capturing apparatus 100.

Second Embodiment

In the following, a cooling operation of an image capturing apparatus 100 in a second embodiment will be described.

Figure 4:
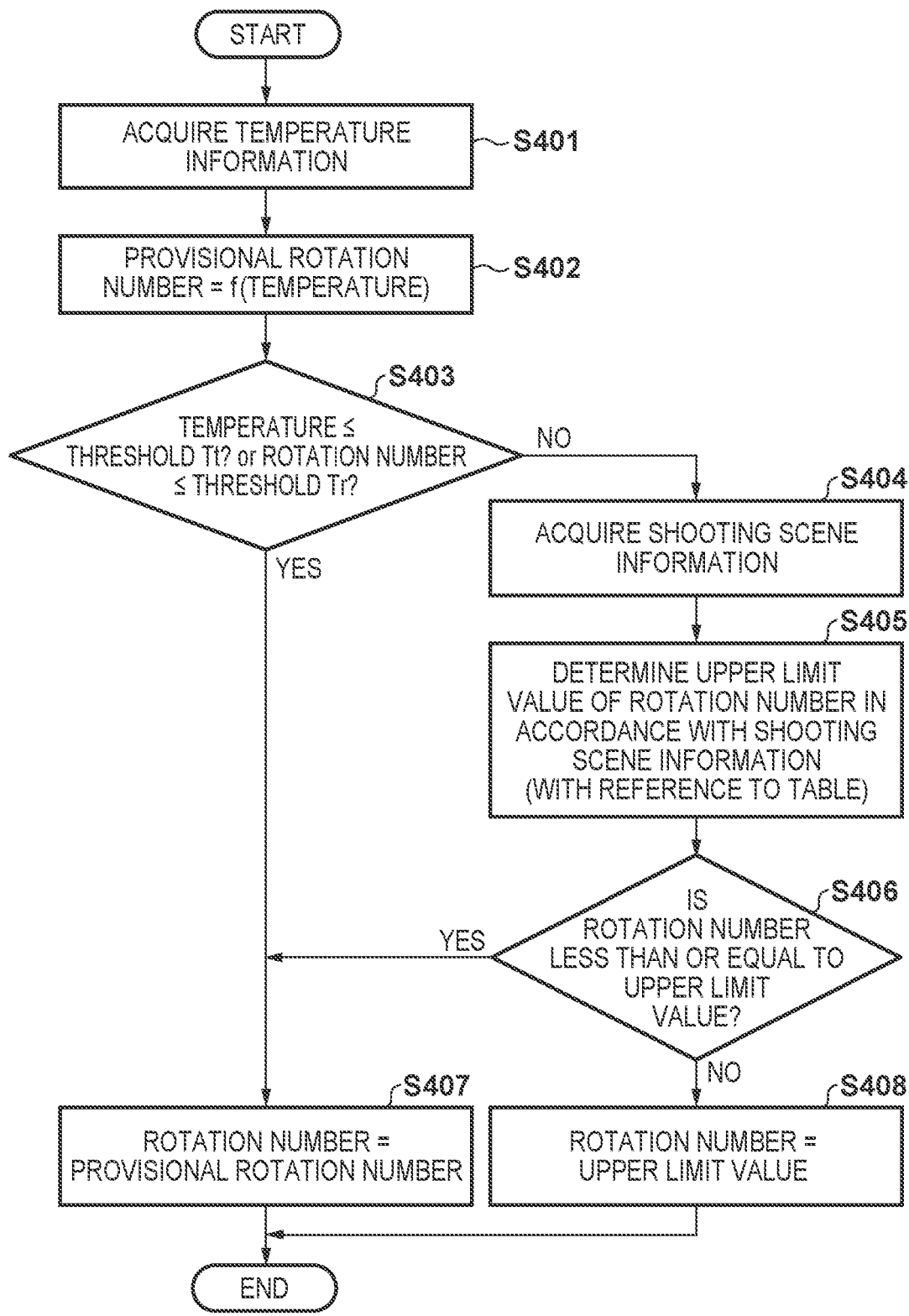
FIG. 4 is a flowchart illustrating fan rotation number determination processing in a second embodiment.

FIG. 4 is a flowchart illustrating processing performed by a fan control unit 107 in the second embodiment. Note that, similarly to the first embodiment, the fan control unit 107 regularly (e.g., 10 seconds interval) executes the processing corresponding to the flowchart in FIG. 4. In the following, the processing performed by the fan control unit 107 of the second embodiment will be described with reference to FIG. 4. Note that the apparatus configuration is the same as that shown in FIG. 1.

In steps S401 and S402, processing similar to that in steps S201 and S202 in FIG. 2 is performed, and therefore the description thereof will be omitted.

In step S403, the fan control unit 107 compares the temperature indicated by temperature information acquired from a thermometer 106 with a predetermined temperature threshold $T_t$. Furthermore, the fan control unit 107 compares the provisional rotation number calculated in step S402 with a predetermined rotation number threshold $T_r$. Here, the rotation number threshold $T_r$ is defined as a rotation number at which the fan operating noise begins to influence on shooting in a relatively soundless environment, for example. Also, the temperature threshold $T_t$ is defined as a temperature obtained by transforming the rotation number threshold. When the temperature is the threshold $T_t$ or less, or the fan rotation number is the threshold $T_r$ or less, the fan control unit 107 advances the processing to step S407. Also, when the temperature exceeds the threshold $T_t$, and the fan rotation number exceeds the threshold $T_r$, the fan control unit 107 advances the processing to step S404.

Note that, in step S403, two comparisons are performed, namely a comparison between temperature and a threshold, and a comparison between a rotation number and a threshold, but the configuration may also be such that only one of the comparisons is performed.

In steps S404 and S405, processing similar to that in steps S203 and S204 in FIG. 2 is performed, and therefore the description thereof will be omitted.

Upon ending the processing in step S405, the fan control unit 107 advances the processing to step S406. In step S406, the fan control unit 107 compares the provisional rotation number obtained in step S402 with a rotation number upper limit that is obtained in step S405 and is determined based on the shooting scene. If the provisional rotation number is the rotation number upper limit value or less, the fan control unit 107 advances the processing to step S407. Also, if the provisional rotation number exceeds the rotation number upper limit value, the fan control unit 107 advances the processing to step S408.

In steps S407 and S408, processing similar to that in steps S206 and S207 in FIG. 2 is performed, and therefore the description thereof will be omitted.

As described above, according to the second embodiment, only when the temperature of the image capturing apparatus 100 increases, the shooting scene information is used to determine the fan rotation number. When the temperature is sufficiently low, cooling by a high speed rotation of the fan is not needed, and as a result, fan operating noise will not influence on shooting in almost all shooting scenes. That is, if the temperature is low, the shooting scene need not be determined. In the period in which scene determination is not performed, the computation amount in a system control unit 103 can be reduced, and therefore the power consumption of the system control unit 103 can be reduced. Furthermore, it is also possible to cut off power to devices needed for scene determination, and therefore further reduction of power consumption is possible.

Note that in the first and second embodiments, fan control is performed such that, with respect to the fan rotation number calculated from temperature information, the fan is operated at a rotation number less than or equal to the rotation number upper limit determined based on the shooting scene. However, the fan control may also be performed such that, with respect to the fan rotation number that is calculated from an element other than the temperature information, or calculated using any algorithm, the fan is operated at a rotation number less than or equal to the rotation number upper limit determined based on the shooting scene.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to embodiments, it is to be understood that the invention is not limited to the disclosed embodiments. The scope of the following claims is to be accorded the broadest interpretation so as to encompass all modifications, equivalent structures and functions.

This application claims the benefit of Japanese Patent Application No. 2021-172650, filed Oct. 21, 2021, which is hereby incorporated by reference herein in its entirety.

What is claimed is:

1. An image capturing apparatus including an image capturing unit, comprising one or more processors which function as:
   a determination unit that determines a subject and a shooting environment based on data obtained by the image capturing unit, the data indicating how sensitive the shooting environment is to an operating noise of a fan;
   an air cooling unit that rotates the fan for cooling the image capturing apparatus;
   a thermometer that measures temperature of the image capturing apparatus; and
   a control unit that calculates a fan rotation number per unit time of the fan rotated by the air cooling unit based on the temperature measured by the thermometer,
   wherein the control unit further sets a fan rotation number upper limit value of the fan rotated by the air cooling unit according to the result of determination by the determination unit, and if the calculated fan rotation number per unit time exceeds the fan rotation number upper limit value, the control unit limits the fan rotation number per unit time to the fan rotation number upper limit value to limit the operating noise of the fan to minimize interference with the shooting environment even when the temperature indicates the fan rotation number greater than the upper limit value of the shooting environment.

2. The apparatus according to claim 1, wherein the control unit sets, in a period in which the determination unit is unable to perform determination, a smallest value of a group of settable candidate values as the fan rotation number upper limit value of the air cooling unit.

3. The apparatus according to claim 1, wherein the one or more processors further functions as a power switch for starting up,
   wherein the control unit sets, in a period from when the power switch is turned on until when the determination unit makes first determination, a smallest value of a group of settable candidate values as the fan rotation number upper limit value of the air cooling unit.

4. The apparatus according to claim 1, wherein the control unit controls the fan rotation number per unit time so as to stop the fan rotated by the air cooling unit in a period in which the determination unit is unable to determine a subject and a shooting environment.

5. The apparatus according to claim 1,
   wherein if the calculated fan rotation number per unit time is less than or equal to the upper limit value, the control unit uses the calculated fan rotation number per unit time.

6. The apparatus according to claim 1,
wherein if the temperature obtained by the thermometer is less than or equal to a preset first threshold, or if the calculated fan rotation number per unit time is less than or equal to a preset second threshold, the control unit further controls the determination unit to not perform determination processing, and uses the calculated rotation number per unit time.

7. A control method of an image capturing apparatus including an image capturing unit, comprising:
- determining a subject and a shooting environment based on data obtained by the image capturing unit, the data indicating how sensitive the shooting environment is to an operating noise of a fan;
- measuring temperature of the image capturing apparatus;
- calculating a fan rotation number per unit time of the fan for cooling the image capturing apparatus based on the measured temperature;
- setting a fan rotation number upper limit value according to the result of the determination;
- limiting, if the calculated fan rotation number per unit time exceeds the fan rotation number upper limit value, the calculated fan rotation number per unit time to the fan rotation number upper limit value to limit the operating noise of the fan to minimize interference with the shooting environment even when the temperature indicates the fan rotation number greater than the upper limit value of the shooting environment; and
- rotating the fan with the calculated or limited fan rotation number per unit time.

8. A non-transitory computer-readable storage medium storing a program which, when read and executed by a computer, causes the computer to perform the steps of a control method of an image capturing apparatus including an image capturing unit, the method comprising:
- determining a subject and a shooting environment based on data obtained by the image capturing unit, the data indicating how sensitive the shooting environment is to an operating noise of a fan;
- measuring temperature of the image capturing apparatus;
- calculating a fan rotation number per unit time of the fan for cooling the image capturing apparatus based on the measured temperature:
- setting a fan rotation number upper limit value according to the result of the determination;
- limiting, if the calculated fan rotation number per unit time exceeds the fan rotation number upper limit value, the calculated fan rotation number per unit time to the fan rotation number upper limit value to limit the operating noise of the fan to minimize interference with the shooting environment even when the temperature indicates the fan rotation number greater than the upper limit value of the shooting environment; and
- rotating the fan with the calculated or limited fan rotation number per unit time.

* * * * *